(12) United States Patent
Ahn et al.

(10) Patent No.: US 11,628,535 B2
(45) Date of Patent: Apr. 18, 2023

(54) POLISHING PAD, METHOD FOR MANUFACTURING POLISHING PAD, AND POLISHING METHOD APPLYING POLISHING PAD

(71) Applicant: SKC SOLMICS CO., LTD., Pyeongtaek-si (KR)

(72) Inventors: Jaein Ahn, Seongnam-si (KR); Jang Won Seo, Suwon-si (KR); Jong Wook Yun, Suwon-si (KR); Sunghoon Yun, Seongnam-si (KR); Hye Young Heo, Yongin-si (KR); Su Young Moon, Anyang-si (KR)

(73) Assignee: SKC SOLMICS CO., LTD., Pyeongtaek-si (KR)

(*) Notice: Subject to any disclaimer, the term of this patent is extended or adjusted under 35 U.S.C. 154(b) by 860 days.

(21) Appl. No.: 16/584,145

(22) Filed: Sep. 26, 2019

(65) Prior Publication Data

US 2021/0094144 A1 Apr. 1, 2021

(51) Int. Cl.
*B24B 37/24* (2012.01)
*C08G 18/50* (2006.01)
(Continued)

(52) U.S. Cl.
CPC .............. *B24B 37/24* (2013.01); *B24B 37/22* (2013.01); *C08G 18/10* (2013.01);
(Continued)

(58) Field of Classification Search
CPC ..... B32B 37/24; B32B 37/22; H01L 21/3212; C08G 18/5015
See application file for complete search history.

(56) References Cited

U.S. PATENT DOCUMENTS

| 3,972,856 A | 8/1976 | Mitsch et al. |
|---|---|---|
| 2006/0089094 A1 | 4/2006 | Swisher et al. |
| 2011/0232530 A1* | 9/2011 | Dams ................. C08G 18/8077 556/419 |
| 2020/0215661 A1* | 7/2020 | Zhu ................... H01L 21/30625 |

FOREIGN PATENT DOCUMENTS

| CN | 1586002 A | 2/2005 |
|---|---|---|
| CN | 102448669 A | 5/2012 |
| CN | 102601727 A | 7/2012 |

(Continued)

*Primary Examiner* — Michael L Leonard
(74) *Attorney, Agent, or Firm* — NSIP Law (57) ABSTRACT

A polishing pad includes a polyurethane, wherein the polyurethane includes a fluorinated repeating unit represented by Formula 1, wherein the number of defects on a substrate after polishing with the polishing pad and a fumed silica slurry is 40 or less;

[Formula 1]

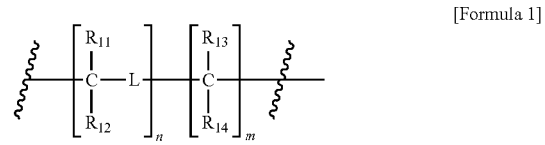

wherein $R_{11}$ and $R_{12}$ are each independently selected from the group consisting of hydrogen, $C_1$-$C_{10}$ alkyl groups, and fluorine, with the proviso that at least one of $R_{11}$ and $R_{12}$ is fluorine, L is a $C_1$-$C_5$ alkylene group or —O—, $R_{13}$ and $R_{14}$ are each independently selected from the group consisting of hydrogen, $C_1$-$C_{10}$ alkyl groups, and fluorine, with the proviso that at least one of $R_{13}$ and $R_{14}$ is fluorine, and n and m are each independently an integer from 0 to 20, with the proviso that n and m are not simultaneously 0.

17 Claims, 2 Drawing Sheets

(51) Int. Cl.
  *C08G 18/38* (2006.01)
  *C08G 18/62* (2006.01)
  *C08G 18/10* (2006.01)
  *H01L 21/321* (2006.01)
  *B24B 37/22* (2012.01)
  *C08L 75/04* (2006.01)
  C08G 101/00 (2006.01)

(52) U.S. Cl.
  CPC ..... *C08G 18/3812* (2013.01); *C08G 18/5015* (2013.01); *C08G 18/6279* (2013.01); *C08L 75/04* (2013.01); *H01L 21/3212* (2013.01); *C08G 2101/00* (2013.01)

(56) References Cited

FOREIGN PATENT DOCUMENTS

| | | | |
|---|---|---|---|
| CN | 108581822 A | 9/2018 |
| CN | 109311138 A | 2/2019 |
| JP | 2004-281812 A | 10/2004 |
| JP | 2017-74649 A | 4/2017 |
| JP | 2019-24079 A | 2/2019 |
| KR | 2001-0088408 A | 9/2001 |
| KR | 10-2005-0040838 A | 5/2005 |
| KR | 10-0892924 B1 | 4/2009 |
| KR | 10-2010-0068653 A | 6/2010 |
| KR | 10-0986935 B1 | 10/2010 |
| KR | 10-1195276 B1 | 10/2012 |
| KR | 10-1352235 B1 | 1/2014 |
| KR | 10-2016-0132882 A | 11/2016 |
| KR | 10-1853021 B1 | 4/2018 |
| WO | WO 2012/172936 A1 | 12/2012 |

\* cited by examiner

POLISHING PAD, METHOD FOR MANUFACTURING POLISHING PAD, AND POLISHING METHOD APPLYING POLISHING PAD

BACKGROUND

1. Field

The present disclosure relates to a polishing pad, a method for manufacturing a polishing pad, and a polishing method using a polishing pad.

2. Description of the Background

Polishing pads are used in chemical mechanical planarization (CMP) for industrially easy surface micromachining and can be widely used to planarize silicon wafers, memory disks, and magnetic disks for semiconductor devices, optical materials such as optical lenses and reflective mirrors, and other materials such as glass plates and metals where high surface planarity is required.

Along with the integration and miniaturization of semiconductor circuits, more and more emphasis has been placed on the importance of the CMP process. CMP pads are essential elements in the CMP process for semiconductor fabrication and play an important role in the determination of CMP performance.

CMP pads are required to have various performance characteristics. Particularly, the number of defects in materials greatly affects the yield of the materials and can thus be considered as a crucial factor in determining the quality of CMP pads.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a polishing pad includes a polyurethane, wherein the polyurethane includes a fluorinated repeating unit represented by Formula 1, wherein the number of defects on a substrate after polishing with the polishing pad and a fumed silica slurry is 40 or less;

[Formula 1]

wherein $R_{11}$ and $R_{12}$ are each independently selected from the group consisting of hydrogen, $C_1$-$C_{10}$ alkyl groups, and fluorine, with the proviso that at least one of $R_{11}$ and $R_{12}$ is fluorine, L is a $C_1$-$C_5$ alkylene group or —O—, $R_{13}$ and $R_{14}$ are each independently selected from the group consisting of hydrogen, $C_1$-$C_{10}$ alkyl groups, and fluorine, with the proviso that at least one of $R_{13}$ and $R_{14}$ is fluorine, and n and m are each independently an integer from 0 to 20, with the proviso that n and m are not simultaneously 0.

The polyurethane may include in its main chain a repeating unit represented by Formula 2-1 or 2-2:

[Formula 2-1]

[Formula 2-2]

wherein $R_{11}$ and $R_{12}$ are each independently selected from the group consisting of hydrogen, $C_1$-$C_{10}$ alkyl groups, and fluorine, with the proviso that at least one of $R_{11}$ and $R_{12}$ is fluorine, L is a $C_1$-$C_5$ alkylene group or —O—, $R_{13}$ and $R_{14}$ are each independently selected from the group consisting of hydrogen, $C_1$-$C_{10}$ alkyl groups, and fluorine, with the proviso that at least one of $R_{13}$ and $R_{14}$ is fluorine, n and m are each independently an integer from 0 to 20, with the proviso that n and m are not simultaneously 0, and $R_{21}$ is —Si($R_{15}$)($R_{16}$)($R_{31}$)—, wherein $R_{15}$ and $R_{16}$ are each independently hydrogen or a $C_1$-$C_{10}$ alkyl group and $R_{31}$ is —$(CH_2)_{m1}$— or —$(CH_2)_{m2}$—$(OCH_2CH_2)_{m3}$—, wherein m1, m2, and m3 are each independently an integer from 1 to 20.

A difference of a contact angle of the polishing pad for pure water and a contact angle of the polishing pad for a fumed silica slurry may be 1.5 to 5, as calculated by Equation 1:

$$Ad_{(p\text{-}f)}(\%)=[100\times(Ap-Af)]/Ap \quad \text{[Equation 1]}$$

where Ap is the contact angle for pure water, Af is the contact angle for a fumed silica slurry, and $Ad_{(p\text{-}f)}$ is the difference between the contact angles.

The polyurethane may be in the form of a foamed body, and the foamed body may have an average pore size of 10 to 30 μm.

The polyurethane may have a Shore D hardness of 55 to 65.

The polishing pad may include a top pad and sub-pad disposed on the top pad, wherein the top pad may include the polyurethane and the sub-pad may include a non-woven fabric or suede type.

In another general aspect, a polishing pad includes a top pad as a polyurethane polishing layer, wherein the polyurethane polishing layer includes a foamed body of a urethane composition, wherein the urethane composition includes a urethane prepolymer, a curing agent, and a foaming agent, wherein the urethane prepolymer is a copolymer of a prepolymer composition including an isocyanate compound, an alcohol compound, and a fluorinated compound, wherein the fluorinated compound includes a fluorinated repeating unit and includes at least one end terminated with a hydroxyl, amine or epoxy group, and wherein the fluorinated repeating unit is represented by Formula 1:

[Formula 1]

wherein $R_{11}$ and $R_{12}$ are each independently selected from the group consisting of hydrogen, $C_1$-$C_{10}$ alkyl groups, and fluorine, with the proviso that at least one of $R_{11}$ and $R_{12}$ is fluorine, L is a $C_1$-$C_5$ alkylene group or —O—, $R_{13}$ and $R_{14}$ are each independently selected from the group consisting of hydrogen, $C_1$-$C_{10}$ alkyl groups, and fluorine, with the proviso that at least one of $R_{13}$ and $R_{14}$ is fluorine, and n and m are each independently an integer from 0 to 20, with the proviso that n and m are not simultaneously 0.

The fluorinated compound may be present in an amount of 0.1 to 5% by weight, based on the total weight of the prepolymer composition.

The top pad may reduce a number of defects of a silicon wafer after polishing by 80% or more compared to polyurethane foamed body without the fluorinated repeating unit represented by Formula 1.

The fluorinated compound may be represented by Formula 3:

[Formula 3]

wherein $R_{11}$ and $R_{12}$ are each independently selected from the group consisting of hydrogen, $C_1$-$C_{10}$ alkyl groups, and fluorine, with the proviso that at least one of $R_{11}$ and $R_{12}$ is fluorine, L is a $C_1$-$C_5$ alkylene group or —O—, $R_{13}$ and $R_{14}$ are each independently selected from the group consisting of hydrogen, $C_1$-$C_{10}$ alkyl groups, and fluorine, with the proviso that at least one of $R_{13}$ and $R_{14}$ is fluorine, n and m are each independently an integer from 0 to 20, with the proviso that n and m are not simultaneously 0, $R_{21}$ and $R_{22}$ are each independently —$(CH_2)_{m1}$— or —$(CH_2)_{m2}$—$(OCH_2CH_2)_{m3}$—, wherein m1, m2, and m3 are each independently an integer from 1 to 20, and $R_{41}$ and $R_{42}$ are each independently a hydroxyl, amine or epoxy group.

The % NCO of the prepolymer may be from 8 to 12% by weight.

In another general aspect, a method for manufacturing a polishing pad includes i) preparing a polyurethane in a form of a foamed body with polymerizing a urethane composition, ii) manufacturing a top pad including the polyurethane, and iii) fixing the top pad to a sub-pad by lamination to prepare the polishing pad, wherein the urethane composition includes a urethane prepolymer, a curing agent, and a foaming agent, wherein the polyurethane includes a fluorinated repeating unit represented by Formula 1, and the polyurethane contains the fluorinated repeating unit within the main chain thereof;

[Formula 1]

wherein $R_{11}$ and $R_{12}$ are each independently selected from the group consisting of hydrogen, $C_1$-$C_{10}$ alkyl groups, and fluorine, with the proviso that at least one of $R_{11}$ and $R_{12}$ is fluorine, L is a $C_1$-$C_5$ alkylene group or —O—, $R_{13}$ and $R_{14}$ are each independently selected from the group consisting of hydrogen, $C_1$-$C_{10}$ alkyl groups, and fluorine, with the proviso that at least one of $R_{13}$ and $R_{14}$ is fluorine, and n and m are each independently an integer from 0 to 20, with the proviso that n and m are not simultaneously 0.

The urethane prepolymer may be prepared by a method including allowing a prepolymer composition to react at 50 to 120° C., and the % NCO of the urethane prepolymer may be from 8 to 12% by weight, wherein the prepolymer composition may include an isocyanate compound, an alcohol compound, and a fluorinated compound, and wherein the fluorinated compound may include the fluorinated repeating unit of Formula 1 and at least one end group with a hydroxyl, amine or epoxy group.

The preparation of the prepolymer may include mixing the isocyanate compound and the alcohol compound to prepare a first composition and allowing the first composition to react at 60 to 100° C. for 1 to 5 hours to prepare a first polymer (first step); and mixing the first polymer and the fluorinated compound to prepare a second composition and allowing the second composition to react at 60 to 100° C. for 0.5 to 3 hours to prepare a second polymer (second step).

A method for producing a polished wafer may include mounting the polishing pad and an unpolished wafer in a chemical mechanical planarization (CMP) polisher and polishing the unpolished wafer with the polishing pad while feeding a polishing slurry into the CMP polisher.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of this disclosure. Hereinafter, while embodiments of the present disclosure will be described in detail with reference to the accompanying drawings, it is noted that examples are not limited to the same.

As used herein, the terms "about", "substantially", etc. are intended to allow some leeway in mathematical exactness to account for tolerances that are acceptable in the trade and to prevent any unconscientious violator from unduly taking advantage of the disclosure in which exact or absolute numerical values are given so as to help understand the application. Due to manufacturing techniques and/or tolerances, variations of the shapes shown in the drawings may occur. Thus, the examples described herein are not limited to the specific shapes shown in the drawings, but include changes in shape that occur during manufacturing.

In the present specification, the term "combination of" included in Markush type description means mixture or combination of one or more elements described in Markush type and thereby means that the disclosure includes one or more elements selected from the Markush group.

As used herein, the term "and/or" includes any one and any combination of any two or more of the associated listed items; likewise, "at least one of" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of this disclosure. Further, although the examples described herein have a variety of configurations, other configurations are possible as will be apparent after an understanding of this disclosure.

Herein, it is noted that use of the term "may" with respect to an example, for example, as to what an example may include or implement, means that at least one example exists in which such a feature is included or implemented while all examples are not limited thereto.

One or more examples of a polishing pad for producing a polished substrate with a reduced number of defects, a method for manufacturing the polishing pad, and a polishing method using the polishing pad are described herein.

Polishing pads for chemical mechanical planarization according to the one or more examples disclosed herein, rapidly and accurately polish substrates substantially without defects such as scratches or chatter marks on the substrate surfaces. Example polishing pads for producing polished substrates that can reduce the number of defects while maintaining their other properties at levels equal or better to those of conventional polishing pads are described herein. As described in the one or more examples, use of a polishing pad with a high contact angle for a slurry solution can lead to a significant reduction in the number of defects on a wafer after polishing while preventing the slurry particles from sticking to the polishing pad.

Figure 1:
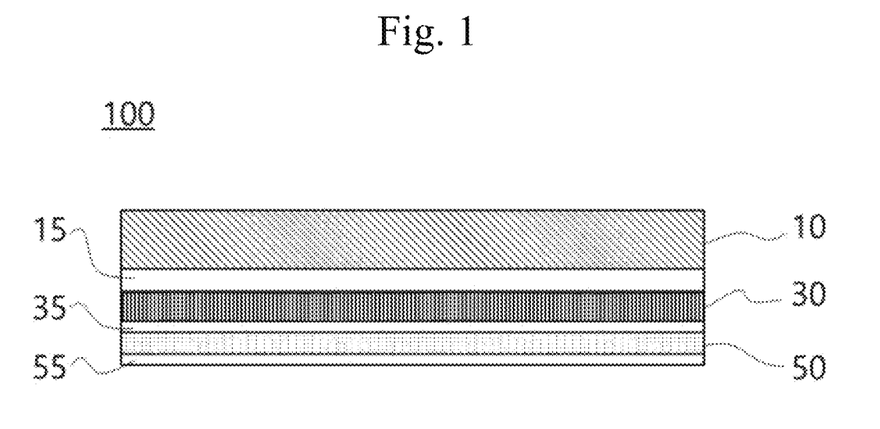
FIG. 1 is a conceptual cross-sectional view of a polishing pad including a top pad according to one or more examples.

FIG. 1 is a conceptual cross-sectional view of a polishing pad according to one or more examples. The examples will be described in more detail with reference to FIG. 1. The polishing pad 100 comprises a polyurethane including a fluorinated repeating unit represented by Formula 1:

[Formula 1]

wherein $R_{11}$ and $R_{12}$ are each independently selected from the group consisting of hydrogen, $C_1$-$C_{10}$ alkyl groups, and fluorine, with the proviso that at least one of $R_{11}$ and $R_{12}$ is fluorine, L is a $C_1$-$C_5$ alkylene group or —O—, $R_{13}$ and $R_{14}$ are each independently selected from the group consisting of hydrogen, $C_1$-$C_{10}$ alkyl groups, and fluorine, with the proviso that at least one of $R_{13}$ and $R_{14}$ is fluorine, and n and m are each independently an integer from 0 to 20, with the proviso that n and m are not simultaneously 0.

For example, in Formula 1, $R_{11}$ and $R_{12}$ are each independently selected from the group consisting of hydrogen, $C_1$-$C_5$ alkyl groups, and fluorine, with the proviso that at least one of $R_{11}$ and $R_{12}$ is fluorine, L is a $C_1$-$C_5$ alkylene group or —O—, $R_{13}$ and $R_{14}$ are each independently selected from the group consisting of hydrogen, $C_1$-$C_5$ alkyl groups, and fluorine, with the proviso that at least one of $R_{13}$ and $R_{14}$ is fluorine, and n and m are each independently an integer from 0 to 10, with the proviso that n and m are not simultaneously 0.

The fluorinated repeating unit represented by Formula 1 may be incorporated into the main chain of the polyurethane. This structure allows the polishing pad 100 to stably and relatively uniformly polish a substrate with a reduced number of defects by chemical mechanical planarization. Particularly, the use of the polishing pad in combination with a fumed silica slurry is very effective in suppressing the formation of defects on a substrate after polishing.

For Example, the polyurethane may comprise a repeating unit represented by Formula 2-1 or 2-2:

[Formula 2-1]

[Formula 2-2]

wherein $R_{11}$ and $R_{12}$ are each independently selected from the group consisting of hydrogen, $C_1$-$C_{10}$ alkyl groups, and fluorine, with the proviso that at least one of $R_{11}$ and $R_{12}$ is fluorine, L is a $C_1$-$C_5$ alkylene group or —O—, $R_{13}$ and $R_{14}$ are each independently selected from the group consisting of hydrogen, $C_1$-$C_{10}$ alkyl groups, and fluorine, with the proviso that at least one of $R_{13}$ and $R_{14}$ is fluorine, n and m are each independently an integer from 0 to 20, with the proviso that n and m are not simultaneously 0, and $R_{21}$ is —Si($R_1$)($R_{16}$)($R_{31}$)—, wherein $R_{15}$ and $R_{16}$ are each independently hydrogen or a $C_1$-$C_{10}$ alkyl group and $R_{31}$ is —$(CH_2)_{m1}$— or —$(CH_2)_{m2}$—$(OCH_2CH_2)_{m3}$— (wherein m1, m2, and m3 are each independently an integer from 1 to 20), For example, in Formula 2-1 or 2-2, $R_{11}$ and $R_{12}$ may each be independently selected from the group consisting of hydrogen, $C_1$-$C_5$ alkyl groups, and fluorine, with the proviso that at least one of $R_{11}$ and $R_{12}$ is fluorine, L may be a $C_1$-$C_5$ alkylene group or —O—, $R_{13}$ and $R_{14}$ are each independently selected from the group consisting of hydrogen, $C_1$-$C_5$ alkyl groups, and fluorine, with the proviso that at least one of $R_{13}$ and $R_{14}$ is fluorine, n and m may each be independently an integer from 0 to 10, with the proviso that n and m are not simultaneously 0, and $R_{21}$ is —Si($R_{15}$)($R_{16}$)($R_{31}$)— (wherein $R_{15}$ and $R_{16}$ may each be independently hydrogen or a $C_1$-$C_5$ alkyl group and $R_{31}$ may be —$(CH_2)_{m1}$— or —$(CH_2)_{m2}$—$(OCH_2CH_2)_{m3}$— (wherein m1, m2, and m3 are each independently an integer from 1 to 10)).

The polyurethane may comprise 0.1 to 5% by weight of the fluorinated repeating unit represented by Formula 2-1 or 2-2. In this case, sticking of slurry particles to the polishing pad can be efficiently prevented, as intended in the present examples.

Due to these features, the polyurethane can be used to constitute the polishing pad 100. In the case where the polishing pad may comprise a top pad 10 and a sub-pad 30, the polyurethane may be applied to the top pad 10 of the polishing pad. The polyurethane may be applied to the surface of the polishing pad. And the polyurethane may be applied to the upper surface of the polishing pad.

The polyurethane may be in the form of a foamed body.

The polyurethane in the form of a foamed body may be prepared by mixing a polyurethane composition with a foaming agent selected from the group consisting of gaseous foaming agents, solid foaming agents, liquid foaming agents, and combinations thereof.

When the polishing pad 100 comprising a top pad 10 is used in combination with a fumed silica slurry to polish a substrate such as a silicon wafer, a reduced number of defects, for example, 40 or less, 25 or less or 10 or less defects, may be formed on the substrate after polishing. The substrate may be disc-shaped one with diameter about 300 mm or more. The substrate may have surface area with about 70685.83 $mm^2$ or more. A number of defects on substrate may be detected based on the surface area.

The number of defects is detected applying a defect inspection system (XP+, Tencor) after the silicon wafer is polished using a CMP polisher, washed, and dried.

The polishing is performed by the following standard procedure. First, a 300 mm-silicon wafer with silicon oxide layer on its surface is mounted in a CMP polisher. The silicon oxide layer of the silicon wafer is in contact with the surface of the polishing pad 100 which attached with a platen. Then, the silicon wafer is polished at a polishing load of 4.0 psi while rotating at 150 rpm for 60 seconds. For this polishing, a slurry such as a fumed silica or ceria slurry may be applied.

The fumed silica slurry may have a pH of 10.5 and may contain silica with an average particle size of 150 nm dispersed therein.

For example, the fumed silica slurry may be prepared by the following procedure. First, a base solution at pH 10.5 including a first pH adjusting agent and ultrapure water is prepared. Ammonia, potassium hydroxide or sodium hydroxide may be used as the first pH adjusting agent. Then, 12% by weight of fumed silica (OCI) is added portionwise to the base solution. The resulting mixture is dispersed using an ultrasonicator at 9000 rpm for about 4 hours to prepare a silica base solution. The silica base solution is further dispersed using a high-pressure homogenizer, added with 0.5 to 2% by weight of an ammonium additive, and stirred for additional 1 hour. Thereafter, 0.01 to 0.1% by weight of a nonionic surfactant (for example, polyethylene glycol) and a second pH adjusting agent are added to prepare a mixed slurry solution at pH 10.5.

Ammonia, potassium hydroxide, sodium hydroxide, nitric acid or sulfonic acid may be used as the second pH adjusting agent. The mixed slurry solution is passed through slurry filters with 3.5 μm and 1 μm pore sizes (Micropore) to prepare the final fumed silica slurry. The final fumed silica slurry may have a pH of 10.5 and contain fumed silica with an average particle size of 150 nm dispersed therein. The average particle size of the fumed silica is measured with a Zetasizer (nano-ZS 90, Malvern). The slurry is used as a reference solution for subsequent contact angle measurement.

When a silicon wafer is polished with the polishing pad 100 at a cutting rate of 45 to 55 μm/hr, the number of the defects on the polished silicon wafer may be 40 or less, 25 or less, or 10 or less.

When a silicon wafer is polished with the polishing pad 100 at a removal rate of 2600 to 2900 Å/min, the number of the defects on the polished silicon wafer may be 40 or less, 25 or less or 10 or.

The contact angles of the polishing pad 100 for pure water and the fumed silica slurry may be different by 1.5 to 5, as calculated by Equation 1:

$$Ad_{(p-f)}(\%) = [100 \times (Ap - Af)] / Ap \quad (1)$$

where Ap is the contact angle for pure water, Af is the contact angle for the fumed silica slurry, and $Ad_{(p-f)}$ is the difference between the contact angles.

When the difference between the contact angles is within the range defined above, the use of the polishing pad in combination with the fumed silica slurry may lead to a significant reduction in the number of defects while maintaining its removal rate and cutting rate at levels substantially equal to or better than those of conventional polishing pads.

The contact angles are measured at room temperature. The fumed silica slurry having a pH of 10.5 and containing fumed silica with an average particle size of 150 nm dispersed therein is used as a reference for the contact angle measurement. The composition and preparation method of the fumed silica slurry are the same as those described above and a further detailed description thereof is thus omitted.

The contact angle of the polishing pad 100 for the fumed silica slurry may be from 85 to 120° or from 90 to 120°.

The contact angle of the polishing pad 100 for pure water may be from 85 to 125° or from 90 to 120°.

The contact angle of the polishing pad 100 for pure water may be different by at least 1.5°, at least 1.8° or at least 2° from that for the fumed silica slurry.

The contact angle of the polishing pad 100 for pure water may be different by 1.2 to 5 or 1.5 to 4° from that for the fumed silica slurry.

Since the contact angle of the polishing pad 100 for pure water is relatively largely different from that for the fumed silica slurry, as mentioned above, the repulsive force between the surface of the polishing pad and the slurry particles may increase when the polishing pad is in contact with the polishing slurry, and as a result, sticking of the slurry particles to the surface of the polishing pad or the pores can be considerably reduced, ensuring high polishing quality.

When the polishing pad 100 whose contact angle for the slurry is relatively largely different from that for pure water is in the form of a foamed body, the number of defects can be more significantly reduced. In many cases, slurry particles may enter and stick to surface micropores of foamed polishing pads, which leads to formation of defects on the surface of substrates after polishing. However, the polishing pad of the examples may significantly reduce this phenomenon.

In the examples, the presence of the fluorinated repeating unit in the main chain of the polyurethane comprising the polishing pad 100 particularly may induce a large repulsive force between the silica particles and the polyurethane surface so that the number of defects can be significantly reduced while substantially maintaining other properties (for example, removal rate and cutting rate) of the polishing pad used in combination with a slurry at levels equal to those of conventional polishing pads.

The polishing pad 100 may comprise a top pad 10, a first adhesive layer 15 disposed on one surface of the top pad, and a sub-pad 30 disposed on one surface of the first adhesive layer 15 opposite the top pad.

The top pad 10 may be the polyurethane in the form of a foamed body whose features have been described above. The top pad 10 may have an average pore size of 10 to 30 μm, which is preferable in improving the polishing efficiency of the polishing pad.

The polyurethane in the form of a foamed body may have an area proportion of 36 to 44%. 350 to 500 pores may be present per unit area (0.3 cm²) of the polyurethane in the form of a foamed body. Due to these features, the use of the polyurethane top pad 10 in the form of a foamed body enables efficient wafer polishing.

The top pad 10 may have a Shore D hardness in the range of 55 to 65. Within this range, high polishing efficiency can be achieved.

The top pad 10 may have a thickness in the range of 1.5 to 3 mm. Within this range, high polishing efficiency can be achieved.

The sub-pad 30 may have an Asker C hardness of 60 to 90.

The sub-pad 30 may be of a non-woven fabric or suede type.

The sub-pad 30 may have a thickness of 0.5 to 1 mm.

The top pad 10 may be attached to the sub-pad 30 through the first adhesive layer 15. In an example, the first adhesive layer 15 may be a hot-melt adhesive layer.

A rubber adhesive may be applied to the other surface of the sub-pad 30 opposite the first adhesive layer 15 to form a second adhesive layer 35.

A film 50 may be disposed on the other surface of the second adhesive layer 35 disposed on the other surface of the sub-pad 30. The film may be, for example, a PET film. A rubber adhesive layer may be formed as a third adhesive layer 55 on the film 50.

The other surface of the sub-pad 30 may be glued to a platen of a polisher through the rubber adhesive layer 35.

A polishing pad 100 according to one or more further examples may comprise a top pad 10 as a polyurethane polishing layer.

The polyurethane polishing layer may comprise a foamed body of a urethane composition.

The urethane composition may comprise a urethane prepolymer, a curing agent, and a foaming agent.

The urethane prepolymer may be a copolymer of a prepolymer composition comprising an isocyanate compound, an alcohol compound, and a fluorinated compound.

The fluorinated compound may be a compound that can react with the isocyanate to introduce the fluorinated repeating unit into the main chain of the urethane.

The fluorinated compound may comprise a fluorinated repeating unit and may have at least one end with a hydroxyl, amine or epoxy group.

For example, the fluorinated compound may be a compound that includes a $C_1$-$C_{10}$ fluoroalkylene group, an ethylene oxide group having a fluorinated branch, and/or a $C_1$-$C_{10}$ fluorocarbon group in the molecule and may be terminated with a hydroxyl, isocyanate, epoxy or amine group.

For example, the fluorinated compound may comprise the fluorinated repeating unit of Formula 1, and may be terminated with a hydroxyl, amine or epoxy group at at least one end.

[Formula 1]

The repeating unit of Formula 1 is the same as that described above and a further detailed description thereof is thus omitted.

The fluorinated compound may be present in an amount of 0.1 to 5% by weight, 1 to 3% by weight or 1.5 to 2.5% by weight, based on the total weight of the prepolymer composition. If the fluorinated compound is present in an amount less than 0.1% by weight, based on the total weight of the prepolymer composition, the effect of the fluorinated compound to reduce the number of defects may be insufficient. Meanwhile, if the fluorinated compound is present in an amount exceeding 5% by weight, gelation may occur during synthesis, making it difficult to achieve the desired physical properties. The presence of the fluorinated compound in the above amount enables the polyurethane polishing pad to effectively reduce the number of defects.

For example, the top pad 10 may reduce the number of defects of a silicon wafer after polishing by 85% or more, 88% or more or 92% or more compared to polyurethane foamed body without the fluorinated repeating unit represented by Formula 1. The reduced number of defects is obtained when the cutting rate and removal rate are at levels substantially equal to or greater than those of conventional polyurethane polishing pads, contributing to a significant reduction in the defective proportion of silicon wafers.

The fluorinated compound may be represented by Formula 3:

[Formula 3]

wherein $R_{11}$ and $R_{12}$ are each independently selected from the group consisting of hydrogen, $C_1$-$C_{10}$ alkyl groups, and fluorine, with the proviso that at least one of $R_{11}$ and $R_{12}$ is fluorine, L is a $C_1$-$C_5$ alkylene group or —O—, $R_{13}$ and $R_{14}$ are each independently selected from the group consisting of hydrogen, $C_1$-$C_{10}$ alkyl groups, and fluorine, with the proviso that at least one of $R_{13}$ and $R_{14}$ is fluorine, n and m are each independently an integer from 0 to 20, with the proviso that n and m are not simultaneously 0, $R_{21}$ and $R_{22}$ are each independently —$(CH_2)_{m1}$— or —$(CH_2)_{m2}$—$(OCH_2CH_2)_{m3}$— (wherein m1, m2, and m3 are each independently an integer from 1 to 20), and $R_{41}$ and $R_{42}$ are each independently a hydroxyl, amine or epoxy group.

For example, in Formula 3, $R_{11}$ and $R_{12}$ may each be independently selected from the group consisting of hydrogen, $C_1$-$C_5$ alkyl groups, and fluorine, with the proviso that at least one of $R_{11}$ and $R_{12}$ is fluorine, L may be a $C_1$-$C_5$ alkylene group or —O—, $R_{13}$ and $R_{14}$ may each be independently selected from the group consisting of hydrogen, $C_1$-$C_5$ alkyl groups, and fluorine, with the proviso that at least one of $R_{13}$ and $R_{14}$ is fluorine, n and m may each be independently an integer from 0 to 10, with the proviso that n and m are not simultaneously 0, $R_{21}$ and $R_{22}$ may each be independently —$(CH_2)_{m1}$— or —$(CH_2)_{m2}$—$(OCH_2CH_2)_{m3}$— (wherein m1, m2, and m3 may each be independently an integer from 1 to 10), and $R_{41}$ and $R_{42}$ may each be independently a hydroxyl, amine or epoxy group.

For example, in Formula 3, $R_{11}$ and $R_{12}$ may each be independently selected from the group consisting of hydrogen, methyl, ethyl, and fluorine, with the proviso that at least one of $R_{11}$ and $R_{12}$ is fluorine, L may be methylene, ethylene, propylene or —O—, $R_{13}$ and $R_{14}$ may each be independently selected from the group consisting of hydrogen, methyl, ethyl, and fluorine, with the proviso that at least one of $R_{13}$ and $R_{14}$ is fluorine, n and m may each be independently an integer from 0 to 10, with the proviso that n and m are not simultaneously 0, $R_{21}$ and $R_{22}$ may each be independently —$(CH_2)_{m1}$— or —$(CH_2)_{m2}$—$(OCH_2CH_2)_{m3}$— (wherein m1, m2, and m3 may each be independently an integer from 1 to 10), and $R_{41}$ and $R_{42}$ may be hydroxyl groups.

The isocyanate compound may be selected from the group consisting of, but not limited to, p-phenylene diisocyanate, 1,6-hexamethylene diisocyanate, toluene diisocyanate, 1,5-naphthalene diisocyanate, isophorone diisocyanate, 4,4-diphenylmethane diisocyanate, cyclohexylmethane diisocyanate, and combinations thereof.

The alcohol compound may comprise a polyol compound, a monomeric alcohol compound or a mixture thereof.

The polyol compound may be selected from the group consisting of, but not limited to, polyester polyol, polyether polyol, polycarbonate polyol, polycaprolactone polyol, and combinations thereof.

The monomeric alcohol compound may be selected from the group consisting of, but not limited to, ethylene glycol, diethylene glycol, propylene glycol, trimethylene glycol, methylpropanediol, and combinations thereof.

The urethane prepolymer may be a copolymer of the isocyanate compound, the alcohol compound, and the fluorinated compound.

The prepolymer composition may comprise 0.7 to 1.3 parts per weight of the alcohol compound based on 1 parts per weight of the isocyanate compound. The prepolymer composition may comprise 0.05 to 7% by weight of the fluorinated compound based on the total weight of the prepolymer composition.

The prepolymer composition may comprise 0.8 to 1.2 parts per weight of the alcohol compound based on 1 parts per weight of the isocyanate compound. The prepolymer composition may comprise 0.01 to 5% by weight of the fluorinated compound based on the total weight of the prepolymer composition.

The prepolymer composition may comprise 0.85 to 1.15 parts per weight of the alcohol compound based on 1 parts per weight of the isocyanate compound. The prepolymer composition may comprise 1.6 to 2.5% by weight of the fluorinated compound based on the total weight of the prepolymer composition.

When the amounts of the components are within the respective ranges defined above, the prepolymer composition may provide a polyurethane having more suitable physical properties for the polishing pad.

The % NCO of the prepolymer may be in the range of 8 to 12% by weight. Within this range, the polyurethane pad can be manufactured in the form of a foamed body with appropriate hardness and is made porous. Herein, % NCO may refer to a measure of the isocyanate content of a prepolymer or other isocyanate-containing compound measured as the weight percent of unreacted isocyanate groups in the material. % NCO value may be used to determine proper mix ratio of polyurethane system components.

The curing agent may be, for example, an amine curing agent.

Specifically, the amine curing agent may be selected from the group consisting of 4,4'-methylenebis(2-chloroaniline), m-phenylenediamine, diethyltoluenediamine, hexamethylenediamine, and combinations thereof.

The foaming agent may be a gaseous foaming agent, a solid foaming agent, a liquid foaming agent or a combination thereof.

Specifically, the gaseous foaming agent may be an inert gas, for example, nitrogen or carbon dioxide gas.

The solid foaming agent may be in the form of organic hollow spheres and/or inorganic hollow spheres, for example, microspheres in which a hydrocarbon gas is encapsulated with a polymer.

Examples of suitable liquid foaming agents may comprise, but are not limited to, Galden solution (triperfluoropropylamine), liquid carbon dioxide, and liquid hydrofluorocarbons.

The urethane composition may further comprise a surfactant. The surfactant may be a nonionic or ionic surfactant. The surfactant may be a silicone surfactant, for example, a copolymer containing at least one block comprising polydimethylsiloxane and at least one block comprising a polyether, polyester, polyamide or polycarbonate segment, but is not limited thereto.

The urethane composition may comprise, based on 100 parts per weight of the urethane prepolymer, 10 to 60 parts per weight of the curing agent, 0.1 to 10 parts per weight of the foaming agent, and 0.1 to 2 parts per weight of the surfactant. The gaseous foaming agent may be released at a rate of 0.1 to 2.0 L/min. When the amounts of the components are within the respective ranges defined above, the urethane composition may provide a polyurethane in the form of a foamed body having suitable physical properties for the polishing pad.

A method for preparing a urethane prepolymer for a polishing pad according to one or more other examples comprises allowing a prepolymer composition to react at 50 to 120° C. wherein the % NCO of the urethane prepolymer is from 8 to 12% by weight.

The prepolymer composition may comprise an isocyanate compound, an alcohol compound, and a fluorinated compound.

The fluorinated compound may comprise the fluorinated repeating unit of Formula 1 and terminated with a hydroxyl, amine or epoxy group at at least one end thereof.

The preparation of the prepolymer may comprise: mixing the isocyanate compound and the alcohol compound to prepare a first composition and allowing the first composition to react at 60 to 100° C. for 1 to 5 hours to prepare a first polymer (first step); and mixing the first polymer and the fluorinated compound to prepare a second composition and allowing the second composition to react at 60 to 100° C. for 0.5 to 3 hours to prepare a second polymer (second step).

The isocyanate compound, the alcohol compound, the fluorinated compound, and the prepolymer composition are the same as those described above and a further detailed description thereof is thus omitted.

A method for manufacturing a polishing pad 100 according to one or more other examples comprises i) preparing a polyurethane in the form of a foamed body with polymerizing a urethane composition, ii) manufacturing a top pad comprising the polyurethane, and iii) fixing the top pad to a sub-pad by lamination to prepare the polishing pad.

The isocyanate compound, the alcohol compound, the fluorinated compound, the prepolymer composition, and the urethane composition are the same as those described above and a further detailed description thereof is thus omitted.

A method for producing a polished wafer according to still other examples comprises mounting the polishing pad 100 and an unpolished wafer in a CMP polisher and polishing the unpolished wafer with the polishing pad while feeding a polishing slurry into the CMP polisher.

For example, the unpolished wafer may be a silicon wafer, for example, a silicon wafer with silicon oxide layer on its surface.

The polishing slurry may comprise fumed silica, colloidal silica or ceria.

The polishing may be performed by pressing the unpolished wafer against the polishing pad such that the unpolished wafer and the polishing pad are brought into contact with each other. The pressing pressure may be from 1 to 7 psi.

The polishing may be performed by rotating the unpolished wafer and/or the polishing pad. The rotational speed may be from 10 to 400 rpm.

The polishing may be performed for 1 to 10 minutes. The polishing time may be increased or decreased as needed.

The method may further comprise washing the polished wafer.

After separation from the CMP polisher, the polished wafer may be washed with deionized water and an inert gas (e.g., nitrogen gas).

The use of the polishing pad in the method of the present examples enables the production of a polished wafer with a reduced number of defects while possessing high levels of removal rate and cutting rate.

Hereinafter, one or more examples will be described in further detail.

1. Manufacture of Polishing Pads

Example 1: Manufacture of Sheet-Like Top Pad

Toluene diisocyanate (TDI) as an isocyanate compound was allowed to react with polytetramethylene ether glycol (PTMEG) and diethylene glycol as polyol compounds in a 4-neck flask at 80° C. for 3 h to obtain a primary reaction product. The primary reaction product was allowed to react with trifluoroethanol in a 4-neck flask at 80° C. for 2 h to prepare a prepolymer whose % NCO was 8-12 wt %. The trifluoroethanol was used in an amount of 2 wt %, based on the total weight of the prepolymer.

The prepolymer, bis(4-amino-3-chlorophenyl)methane (Ishihara) as a curing agent, and an inert gas were introduced into a casting machine equipped with a prepolymer tank, a curing agent tank, and an inert gas supply line. The prepolymer was filled in the prepolymer tank and the curing agent was filled in the curing agent tank. Nitrogen gas ($N_2$) was used as the inert gas. A solid foaming agent (Akzonobel) and a silicone surfactant (Evonik) were introduced into the casting machine through separate lines or were previously mixed with the prepolymer.

The equivalent ratio of the prepolymer to the curing agent in the casting machine was adjusted to 1:1. The raw materials were cast at a rate of 10 kg/min from the casting machine. The inert nitrogen ($N_2$) gas was fed at the rate indicated in Table 1 relative to the total flow volume.

After the raw materials were fed at high rates and mixed in a mixing head, a controlled amount of the inert gas was introduced into a mold having dimensions of 1000 mm (w)×1000 mm (l)×3 mm (h). A porous sheet-like top pad 10 having a specific gravity of 0.8-0.9 g/cc was obtained.

Example 2: Manufacture of Sheet-Like Top Pad

Toluene diisocyanate (TDI) as an isocyanate compound, polytetramethylene ether glycol (PTMEG) and diethylene glycol as polyol compounds, and a fluorinated polyol (Fluorolink® E-10H, Solvay) as a fluorinated compound were placed in a 4-neck flask. The reaction was allowed to proceed at 80° C. to prepare a prepolymer whose % NCO was 8-12%. The fluorinated compound was used in an amount of 2 wt %, based on the total weight of the prepolymer.

The subsequent procedure was carried out in the same manner as in Example 1 to manufacture a sheet-like top pad 10.

Comparative Example 1: Manufacture of Sheet-Like Top Pad

Toluene diisocyanate (TDI) as an isocyanate compound and polytetramethylene ether glycol (PTMEG) and diethylene glycol as polyol compounds were placed in a 4-neck flask. The reaction was allowed to proceed at 80° C. to prepare a prepolymer whose % NCO was 8-12 wt %.

The subsequent procedure was carried out in the same manner as in Example 1 to manufacture a sheet-like top pad.

TABLE 1

|  | Amounts used during casting | | |
| --- | --- | --- | --- |
|  | Example 1 | Example 2 | Comparative Example 1 |
| Prepolymer (parts per weight) | 100 | 100 | 100 |
| Curing agent (parts per weight) | 25 | 25 | 25 |
| Surfactant (parts per weight) | 0.2-1.5 | 0.2-1.5 | 0.2-1.5 |
| Solid foaming agent (parts per weight) | 0.5-1.0 | 0.5-1.0 | 0.5-1.0 |
| Inert gas (L/min) | 0.5-1.5 | 0.5-1.5 | 0.5-1.5 |

Manufacture of Polishing Pads

Each of the sheet-like top pads 10 was sequentially subjected to surface milling and grooving in accordance with general methods known in the art. The processed top pad was laminated on a sub-pad 30 to manufacture a polishing pad 100 having the structure illustrated in FIG. 1.

2. Evaluation of Physical Properties of the Polishing Pads
Strength and Contact Angle Evaluation The polishing pads of Example 1, Example 2, and Comparative Example 1 were evaluated for physical properties, including contact angles for fumed silica slurry, CMP polishing performance, and the number of defects in wafers.

A groove-free central portion of each polishing pad was cut into a specimen having dimensions of 2 cm×2 cm. The contact angles of the specimen were measured using a dynamic contact angle analyzer (DCA-312, CAHN).

After the specimen was mounted in the analyzer, appropriate amounts of pure water ($H_2O$) and a fumed silica slurry filled in separate syringes were injected onto the specimen and the shapes of the droplets on the specimen were measured using the analyzer. The composition and preparation method of the fumed silica slurry are as follows.

Preparation of the Fumed Silica Slurry

First, a solution at pH 10.5 composed of a first pH adjusting agent (e.g., ammonia, potassium hydroxide or sodium hydroxide) and ultrapure water was prepared. ~12 wt % of fumed silica (OCI) was added portionwise to the solution. The resulting mixture was dispersed using an ultrasonicator at a rate of 9000 rpm for ~4 h and was then further dispersed using a high-pressure homogenizer.

After sufficient dispersion, 0.5-2 wt % of an ammonium additive was added, followed by additional stirring for 1 h. Thereafter, 0.01-0.1 wt % of a nonionic surfactant was added and the pH of the resulting solution was adjusted to 10.5 using a second pH adjusting agent (e.g., ammonia, potassium hydroxide, sodium hydroxide, nitric acid or sulfonic acid).

The solution was passed through slurry filters with 3.5 μm and 1 μm pore sizes (Micropore) to obtain the final fumed silica slurry. The physical properties of the final slurry were measured with a Zetasizer (nano-ZS 90, Malvern). As a result, the slurry was found to have a pH of 10.5 and a particle size of 150 nm.

The physical properties of the sub-pads and the polishing pads as well as those of the top pads are shown in Table 2.

TABLE 2

| | | Evaluation parameter | Example 1 | Example 2 | Comparative Example 1 |
| --- | --- | --- | --- | --- | --- |
| Physical properties | Top pad | Thickness (mm) | 2 | 2 | 2 |
| | | Hardness (Shore D) | 60 | 60 | 60 |
| | | Average pore size (μm) | 28 | 27 | 28 |
| | | Specific gravity (g/cc) | 0.8 | 0.8 | 0.8 |
| | | Tensile strength (N/mm$^2$) | 21 | 21.5 | 20.8 |
| | | Elongation (%) | 120 | 118 | 123 |
| | | Shore D hardness values at 30° C./50° C./70° C. | 58/54/51 | 58/54/51 | 58/54/51 |
| | | Contact angle Ap (°, $H_2O$) | 93 | 92 | 71 |
| | | Contact angle Af (°, Fumed silica slurry) | 91 | 90 | 70 |
| | | *Contact angle difference | 2.15% | 2.17% | 1.41% |
| | Sub-pad | Type | Non-woven fabric | Non-woven fabric | Non-woven fabric |
| | | Thickness (mm) | 1.1 | 1.1 | 1.1 |
| | | Hardness (C) | 70 | 70 | 70 |
| | Polishing pad | Thickness (mm) | 3.32 | 3.32 | 3.32 |
| | | Compression rate (%) | 1.05 | 1.05 | 1.05 |

*the difference of the contact angles ($Ad_{(p-f)}$, %) was calculated by $Ad_{(p-f)} = [100*(Ap - Af)]/Ap$ where Ap is the contact angle for pure water and Af is the contact angle for the fumed silica slurry, which were measured at the same room temperature.

As can be seen from the results in Table 2, the hardness, average pore size, and specific gravity of the polishing pad of Comparative Example 1 were similar to those of the polishing pads of Examples 1 and 2 but the contact angles of the polishing pad of Comparative Example 1 for pure water and the fumed silica slurry were significantly different from those of the polishing pads of Examples 1 and 2.

Evaluation of Pore Physical Properties of the Top Pads

Figure 2:
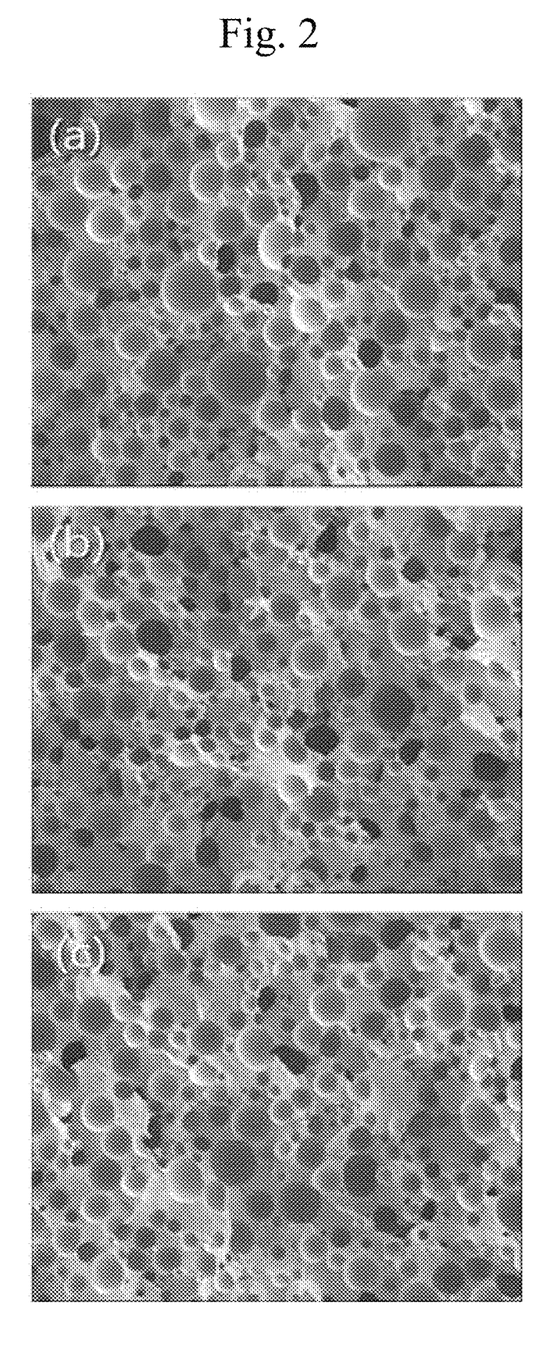
FIG. 2 shows electron microscopy images of pores of top pads manufactured in (a) Example 1, (b) Example 2, and (c) Comparative Example 1.

Each of the top pads was imaged by a scanning electron microscope (SEM) (JEOL) at a magnification of 100×. The number, size, and area proportion of the pores of the top pad were measured. The results are shown in FIG. 2 and Table 3.

TABLE 3

| Pore physical properties of the top pads | Example 1 | Example 2 | Comparative Example 1 |
|---|---|---|---|
| Number average diameter (μm) | 28 | 27 | 28 |
| Counts/0.3 cm² (ea) | 407 | 415 | 402 |
| Area proportion (%) | 39.9 | 41.2 | 39.8 |

Evaluation of Polishing Properties

The removal rates and cut rates (μm/hr) of the polishing pads of Example 1, Example 2, and Comparative Example 1 and the number of defects in wafers after polishing with the polishing pads were measured by the following procedures.

1) Removal Rate Measurement

A 300 mm-diameter silicon wafer deposited with silicon oxide by CVD was mounted in a CMP polisher. The silicon wafer was set on a platen attached with the porous polyurethane polishing pad such that the silicon oxide layer of the silicon wafer faced the underlying polishing pad. Thereafter, the polishing load was adjusted to 4.0 psi. A calcined ceria slurry was supplied at a rate of 250 ml/min on the polishing pad while rotating the platen at 150 rpm for 60 sec to polish the silicon oxide layer. After polishing, the silicon wafer was detached from the carrier, mounted in a spin dryer, washed with deionized water (DIW), and dried with nitrogen for 15 sec.

The thickness of the dried silicon wafer was measured and compared with that of the silicon wafer before polishing. The thicknesses of the silicon wafer before and after polishing were measured using a spectral interference thickness meter (SI-F80R, Kyence).

The removal rate was calculated by Equation 2:

$$\text{Removal rate} = \text{Thickness of silicon wafer after polishing}(\text{Å})/\text{Polishing time}(60\text{ sec}) \quad (2)$$

2) Cutting Rate Measurement

Each of the polishing pads was pre-conditioned with deionized water for the first 10 min and was then conditioned by spraying deionized water for 1 h. The thickness variation was measured during the 1-h conditioning.

A conditioning system (AP-300HM, CTS) was used for conditioning. The conditioning pressure and the rotational speed were adjusted to 6 lbf(pound-force) and 100-110 rpm, respectively. A disk pad (LPX-DS2, SAESOL) was used for conditioning.

3) Defect Measurement

Polishing was performed using a CMP polisher in the same manner as described in the removal rate measurement.

After polishing, the silicon wafer was transferred to a cleaner and cleaned sequentially with 1 wt % HF, deionized water (DIW), 1 wt % $H_2NO_3$, and deionized water (DIW) (for 10 sec each). Thereafter, the cleaned silicon wafer was transferred to a spin dryer, washed with deionized water (DIW), and dried with nitrogen for 15 sec.

The number of defects in the dried silicon wafer was measured and compared with that in the silicon wafer before polishing. The numbers of defects before and after polishing were measured using a defect inspection system (XP+, Tencor).

The removal rates (RR), the cutting rates, and the numbers of defects (#defects per about 300 mm diameter disc, about 70685.83 mm²) are shown in Table 4.

TABLE 4

|  | Example 1 | Example 2 | Comparative Example 1 |
|---|---|---|---|
| RR (Å/min) | 2779 | 2775 | 2759 |
| Number of defects | 5 | 3 | 50 |
| Cutting rate (μm/hr) | 52 | 50 | 50 |
| *Rate of reduction (%) in the number of defects compared to Comparative Example 1 | 90% | 94% | — |

*Rate of reduction (%) in the number of defects was calculated by [(the number of defects after polishing with the polishing pad of Comparative Example 1) − (the number of defects after polishing with the polishing pad of Example 1)*100]/(the number of defects after polishing with the polishing pad of Comparative Example 1).

As can be seen from the results in Table 4, the removal rates and cutting rates of the polishing pads of Examples 1 and 2 were similar to those of the polishing pad of Comparative Example 1, but the numbers of defects in the wafers after polishing with the polishing pads of Examples 1 and 2 were significantly reduced compared to that after polishing with the polishing pad of Comparative Example 1.

The use of the polishing pad according to the examples described herein leads to a significant reduction in the number of defects while maintaining its removal rate and cutting rate at levels equal to or better those of conventional polishing pads. In addition, the manufacturing method of the present application is suitable for manufacturing the polishing pad. Furthermore, the polishing method of the embodiments is suitable for polishing wafers.

While specific examples have been shown and described above, it will be apparent after an understanding of this disclosure that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of this disclosure is defined not by the detailed description, but by the claims and their equivalents, and all variations within the scope of the claims and their equivalents are to be construed as being included in this disclosure.

What is claimed is:

1. A polishing pad comprising a polyurethane, wherein the polyurethane comprises a fluorinated repeating unit represented by Formula 1, and the fluorinated repeating unit is present in an amount of 0.1% or greater by weight based on the total weight of the polyurethane, and wherein the number of defects on a substrate after polishing with the polishing pad and a fumed silica slurry is 40 or less;

[Formula 1]

wherein $R_{11}$ and $R_{12}$ are each independently selected from the group consisting of hydrogen, $C_1$-$C_{10}$ alkyl groups, and fluorine, with the proviso that at least one of $R_{11}$ and $R_{12}$ is fluorine, L is a $C_1$-$C_5$ alkylene group or —O—, $R_{13}$ and $R_{14}$ are each independently selected from the group consisting of hydrogen, $C_1$-$C_{10}$ alkyl groups, and fluorine, with the proviso that at least one of $R_{13}$ and $R_{14}$ is fluorine, and n and m are each independently an integer from 0 to 20, with the proviso that n and m are not simultaneously 0.

2. The polishing pad according to claim 1, wherein the polyurethane comprises in its main chain a repeating unit represented by Formula 2-1 or 2-2:

[Formula 2-1]

[Formula 2-2]

wherein $R_{11}$ and $R_{12}$ are each independently selected from the group consisting of hydrogen, $C_1$-$C_{10}$ alkyl groups, and fluorine, with the proviso that at least one of $R_{11}$ and $R_{12}$ is fluorine, L is a $C_1$-$C_5$ alkylene group or —O—, $R_{13}$ and $R_{14}$ are each independently selected from the group consisting of hydrogen, $C_1$-$C_{10}$ alkyl groups, and fluorine, with the proviso that at least one of $R_{13}$ and $R_{14}$ is fluorine, n and m are each independently an integer from 0 to 20, with the proviso that n and m are not simultaneously 0, and $R_{21}$ is —Si($R_{15}$)($R_{16}$)($R_{31}$)—, wherein $R_{15}$ and $R_{16}$ are each independently hydrogen or a $C_1$-$C_{10}$ alkyl group and $R_{31}$ is —(CH$_2$)$_{m1}$— or —(CH$_2$)$_{m2}$—(OCH$_2$CH$_2$)$_{m3}$—, wherein m1, m2, and m3 are each independently an integer from 1 to 20.

3. The polishing pad according to claim 1, wherein a difference of a contact angle of the polishing pad for pure water and a contact angle of the polishing pad for a fumed silica slurry is 1.5 to 5, as calculated by Equation 1:

$Ad_{(p-f)}(\%)=[100\times(Ap-Af)]/Ap$ [Equation 1]

where Ap is the contact angle for pure water, Af is the contact angle for a fumed silica slurry, and $Ad_{(p-f)}$ is the difference between the contact angles.

4. The polishing pad according to claim 1, wherein the polyurethane is in the form of a foamed body, and the foamed body has an average pore size of 10 to 30 μm.

5. The polishing pad according to claim 1, wherein polyurethane has a Shore D hardness of 55 to 65.

6. The polishing pad according to claim 1, wherein the polishing pad comprises a top pad and sub-pad disposed on the top pad,
wherein the top pad comprises the polyurethane and the sub-pad comprises a non-woven fabric or suede type.

7. A polishing pad comprising a top pad as a polyurethane polishing layer,
wherein the polyurethane polishing layer comprises a foamed body of a urethane composition,
wherein the urethane composition comprises a urethane prepolymer, a curing agent, and a foaming agent,
wherein the urethane prepolymer is a copolymer of a prepolymer composition comprising an isocyanate compound, an alcohol compound, and a fluorinated compound,
wherein the fluorinated compound comprises a fluorinated repeating unit and comprises at least one end terminated with a hydroxyl, amine or epoxy group, and
wherein the fluorinated repeating unit is present in an amount of 0.1% or greater by weight based on the total weight of the polyurethane; and the fluorinated repeating unit is represented by Formula 1:

[Formula 1]

wherein $R_{11}$ and $R_{12}$ are each independently selected from the group consisting of hydrogen, $C_1$-$C_{10}$ alkyl groups, and fluorine, with the proviso that at least one of $R_{11}$ and $R_{12}$ is fluorine, L is a $C_1$-$C_5$ alkylene group or —O—, $R_{13}$ and $R_{14}$ are each independently selected from the group consisting of hydrogen, $C_1$-$C_{10}$ alkyl groups, and fluorine, with the proviso that at least one of $R_{13}$ and $R_{14}$ is fluorine, and n and m are each independently an integer from 0 to 20, with the proviso that n and m are not simultaneously 0.

8. The polishing pad according to claim 7, wherein the fluorinated compound is present in an amount of 0.1 to 5% by weight, based on the total weight of the prepolymer composition.

9. The polishing pad according to claim 7, wherein the top pad reduces a number of defects of a silicon wafer after polishing by 80% or more compared to polyurethane foamed body without the fluorinated repeating unit represented by Formula 1.

10. The polishing pad according to claim 7, wherein the fluorinated compound is represented by Formula 3:

[Formula 3]

wherein $R_{11}$ and $R_{12}$ are each independently selected from the group consisting of hydrogen, $C_1$-$C_{10}$ alkyl groups, and fluorine, with the proviso that at least one of $R_{11}$ and $R_{12}$ is fluorine, L is a $C_1$-$C_5$ alkylene group or —O—, $R_{13}$ and $R_{14}$ are each independently selected from the group consisting of hydrogen, $C_1$-$C_{10}$ alkyl groups, and fluorine, with the proviso that at least one of $R_{13}$ and $R_{14}$ is fluorine, n and m are each independently an integer from 0 to 20, with the proviso that n and m are not simultaneously 0, $R_{21}$ and $R_{22}$ are each independently —(CH$_2$)$_{m1}$— or —(CH$_2$)$_{m2}$—(OCH$_2$CH$_2$)$_{m3}$—, wherein m1, m2, and m3 are each independently an integer from 1 to 20, and $R_{41}$ and $R_{42}$ are each independently a hydroxyl, amine or epoxy group.

11. The polishing pad according to claim 7, wherein the % NCO of the prepolymer is from 8 to 12% by weight.

12. A method for manufacturing a polishing pad, comprising
   i) preparing a polyurethane in a form of a foamed body with polymerizing a urethane composition,
   ii) manufacturing a top pad comprising the polyurethane, and
   iii) fixing the top pad to a sub-pad by lamination to prepare the polishing pad,
   wherein the urethane composition comprises a urethane prepolymer, a curing agent, and a foaming agent, and
   wherein the polyurethane comprises a fluorinated repeating unit represented by Formula 1, the fluorinated repeating unit is present in an amount of 0.1% or greater by weight based on the total weight of the polyurethane, and the polyurethane contains the fluorinated repeating unit within the main chain thereof;

[Formula 1]

wherein $R_{11}$ and $R_{12}$ are each independently selected from the group consisting of hydrogen, $C_1$-$C_{10}$ alkyl groups, and fluorine, with the proviso that at least one of $R_{11}$ and $R_{12}$ is fluorine, L is a $C_1$-$C_5$ alkylene group or —O—, $R_{13}$ and $R_{14}$ are each independently selected from the group consisting of hydrogen, $C_1$-$C_{10}$ alkyl groups, and fluorine, with the proviso that at least one of $R_{13}$ and $R_{14}$ is fluorine, and n and m are each independently an integer from 0 to 20, with the proviso that n and m are not simultaneously 0.

13. The method according to claim 12, wherein the urethane prepolymer is prepared by a method comprising
   allowing a prepolymer composition to react at 50 to 120° C., and the % NCO of the urethane prepolymer is from 8 to 12% by weight,
   wherein the prepolymer composition comprises an isocyanate compound, an alcohol compound, and a fluorinated compound, and
   wherein the fluorinated compound comprises the fluorinated repeating unit of Formula 1 and at least one end group with a hydroxyl, amine or epoxy group.

14. The method according to claim 13, wherein the preparation of the prepolymer comprises:
   mixing the isocyanate compound and the alcohol compound to prepare a first composition and allowing the first composition to react at 60 to 100° C. for 1 to 5 hours to prepare a first polymer (first step); and
   mixing the first polymer and the fluorinated compound to prepare a second composition and allowing the second composition to react at 60 to 100° C. for 0.5 to 3 hours to prepare a second polymer (second step).

15. A method for producing a polished wafer, comprising mounting the polishing pad according to claim 1 and an unpolished wafer in a chemical mechanical planarization (CMP) polisher and polishing the unpolished wafer with the polishing pad while feeding a polishing slurry into the CMP polisher.

16. The polishing pad according to claim 1, wherein n and m are each independently an integer from 1 to 20.

17. The method according to claim 12, wherein n and m are each independently an integer from 1 to 20.

* * * * *